US005465064A

United States Patent [19]

Shou et al.

[11] Patent Number: 5,465,064

[45] Date of Patent: Nov. 7, 1995

[54] WEIGHTED SUMMING CIRCUIT

[75] Inventors: Guoliang Shou; Weikang Yang; Sunao Takatori; Makoto Yamamoto, all of Tokyo, Japan

[73] Assignees: Yozan Inc.; Sharp Corporation, both of Tokyo, Japan

[21] Appl. No.: 190,926

[22] Filed: Feb. 3, 1994

[30] Foreign Application Priority Data

Feb. 4, 1993 [JP] Japan .................................... 5-040424

[51] Int. Cl.[6] .................................................... H03K 12/00

[52] U.S. Cl. ............................................ 327/361; 327/407

[58] Field of Search .................................... 327/361, 355, 327/339, 345, 407; 330/69, 107, 147, 109, 294; 326/35

[56] References Cited

U.S. PATENT DOCUMENTS

| | | | |
|---|---|---|---|
| 3,742,250 | 6/1973 | Kan | 326/35 |
| 4,259,903 | 4/1981 | Arendt et al. | 101/93.03 |
| 4,268,798 | 5/1981 | Reichart | 330/69 |
| 4,760,346 | 7/1988 | Kultgen et al. | 330/69 |
| 4,903,226 | 2/1990 | Tsividis | 364/807 |
| 5,272,481 | 12/1993 | Sauer | 327/63 |

FOREIGN PATENT DOCUMENTS

WO8900739 1/1989 WIPO .

OTHER PUBLICATIONS

Patent Abstracts of Japan, vol. 4, No. 67 (E-100) 20 May 1980 & JP-A-55 034 593; English abstract.
Patent Abstracts of Japan, vol. 13, No. 201 (E-757) 12 May 1989 & JP-A-01 020 788; English abstract.
Derwent Abstract-Soviet Inventions Illustrated, Sec. EQ, Week 8548, 23 May 1985, AN 85-301827 & SU-A-1 157 677 (May 1985).

*Primary Examiner*—Timothy P. Callahan
*Assistant Examiner*—Terry L. Englund
*Attorney, Agent, or Firm*—Cushman, Darby & Cushman

[57] ABSTRACT

A weighted summing circuit for minimizing bias voltage influence includes capacitive coupling and a closed loop inverter. The weighted summing circuit inputs the output of a capacitive coupling $CP_1$ to serially connected first and second inverters $INV_1$ and $INV_2$, and includes grounded weighted capacitances $C_{32}$ and $C_{11}$, capacitance $C_{21}$ connecting the first and the second inverters $INV_1$ and $INV_2$, and a capacitive coupling $CP_1$ such that the closed loop gains of the first and second inverters $INV_1$ and $INV_2$ are substantially equal. The closed loop gains of the first and second inverters $INV_1$ and $INV_2$ are balanced.

4 Claims, 2 Drawing Sheets

WEIGHTED SUMMING CIRCUIT

FIELD OF THE INVENTION

The present invention relates to a weighted summing circuit, especially to a weighted summing circuit using a capacitive coupling.

BACKGROUND OF THE INVENTION

In recent years, digital computer uses have been limited because of an exponential increase in the cost of fine processing technology. As a result, analog computers have been given attention. A weighted summing circuit in an analog computer is formed by capacitive coupling; that is, connecting a plurality of capacitances in parallel to realize a multiplication circuit. However, such a construction leads to low accuracy for generated bias voltage caused by an unfitted threshold value where a closed loop inverter is used to compensate the accuracy of output.

SUMMARY OF THE INVENTION

The present invention solves the conventional problems by providing a weighted summing circuit for minimizing the influence of bias voltage. The weighted summing circuit is provided with capacitive coupling and a closed loop inverter.

A weighted summing circuit according to the present invention, in a composition wherein an output of a capacitive coupling is input to serially connected first and second inverters, connects a grounded weighted capacitance to a capacitance connecting the first and the second inverters and a capacitive coupling such that the closed loop gain of the first and the second inverters are substantially equal.

PREFERRED EMBODIMENT OF THE PRESENT INVENTION

Hereinafter, an embodiment according to the present invention is described with reference to the attached drawings.

Figure 1:
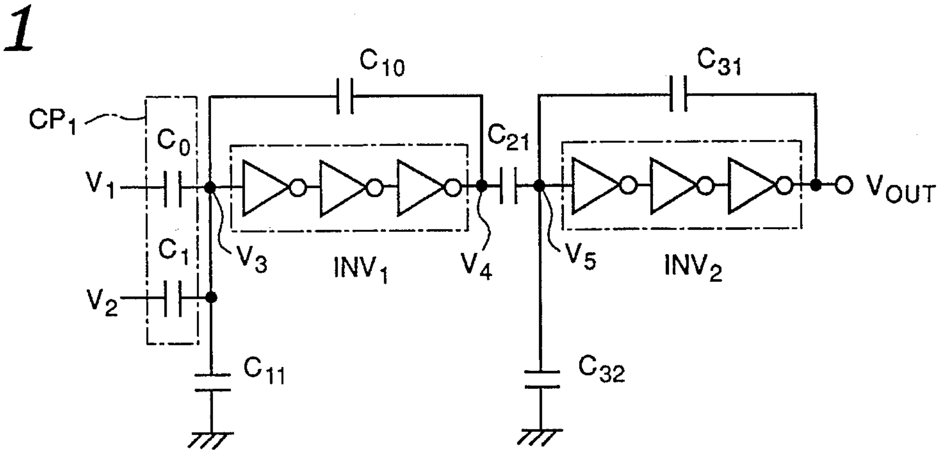
FIG. 1 is a circuit diagram showing an embodiment of a weighted summing circuit relating to the present invention.

In FIG. 1, a weighted summing circuit serially connects a capacitive coupling $CP_1$, and inverters $INV_1$ and $INV_2$. $CP_1$ includes capacitances $C_0$ and $C_1$ connected in parallel.

The output of $INV_1$ is fed back to its input through capacitance $C_{10}$, and is input to $INV_2$ through capacitance $C_{21}$. The output of $INV_2$ is fed back to its input through capacitance $C_{31}$. Furthermore, weighted capacitances $C_{11}$ and $C_{32}$ are connected in parallel to $CP_1$ and $C_{21}$, respectively.

In $CP_1$, voltages $V_1$ and $V_2$ are input to capacitances $C_0$ and $C_1$, respectively.

The output voltages of $INV_1$ and $INV_2$ are equal, and their value is Voff. If the input and output voltages of $INV_1$ are $V_3$ and $V_4$, respectively, and the input voltage of $INV_2$ is $V_5$, then formula (1) is obtained.

$$(C_0V_1+C_1V_2+C_{10}V_4)/(C_0+C_1+C_{10}-C_{11})=V_3 \quad (1)$$

Formula (1) may be restated as formula (2).

$$V_4=\{V_3(C_0+C_1+C_{10}-C_{11})-(C_0V_1+C_1V_2)\}/C_{10} \quad (2)$$

Formula (3) may be restated as formula (4).

$$(C_{21}V_4+C_{31}V_{out})/(C_{21}+C_{31}-C_{32})=V_5 \quad (3)$$

$$V_{out}=\{V_5(C_{21}+C_{31}-C_{32})-C_{21}V_4\}/C_{31} \quad (4)$$

If formula (2) is applied to formula (4), then formula (5) is obtained.

$$V_{out}=V_5(C_{21}+C_{31}-C_{43})/C_{31}-V_3C_{21}(C_0+C_1+C_{10}-C_{11})/C_{10}C_{31}-(C_0V_1+C_1V_2)C_{21}/C_{10}C_{31} \quad (5)$$

If $V_1=V_2=0$, then $V_3=V_5=V_{off}$, and formula (6) is established.

$$V_{out}=V_{off}(C_{21}+C_{31}-C_{32})/C_{31}-V_{off}C_{21}(C_0+C_1+C_{10}-C_{11})/C_{10}C_{31} \quad (6)$$

If the offset is deleted, then $V_{out}=0$. The right side of formula (6) becomes 0.

$$(C_{21}+C_{31}-C_{32})C_{10}=(C_0+C_1+C_{10}-C_{11})C_{21} \therefore (C_{21}+C_{31}-C_{32})C_{21}=(C_0+C_1+C_{10}-C_{11})/C_{10} \quad (7)$$

Formula (7) shows that closed loop gains of $INV_1$ and $INV_2$ are equal.

If $C_{11}$ and $C_{32}$ do not exist, then formula (8) is obtained.

$$C_{32}/C_{21}=(C_0+C_1)/C_{10} \quad (8)$$

In this case, the range of $C_0$, $C_1$, $C_{10}$, $C_{21}$ and $C_{32}$ is very limited. That is, due to the weighted capacitances $C_{11}$ and $C_{32}$, there is an increased degree of freedom in setting the range of $C_0$, $C_1$, $C_{10}$, $C_{21}$ and $C_{32}$.

Figure 2:
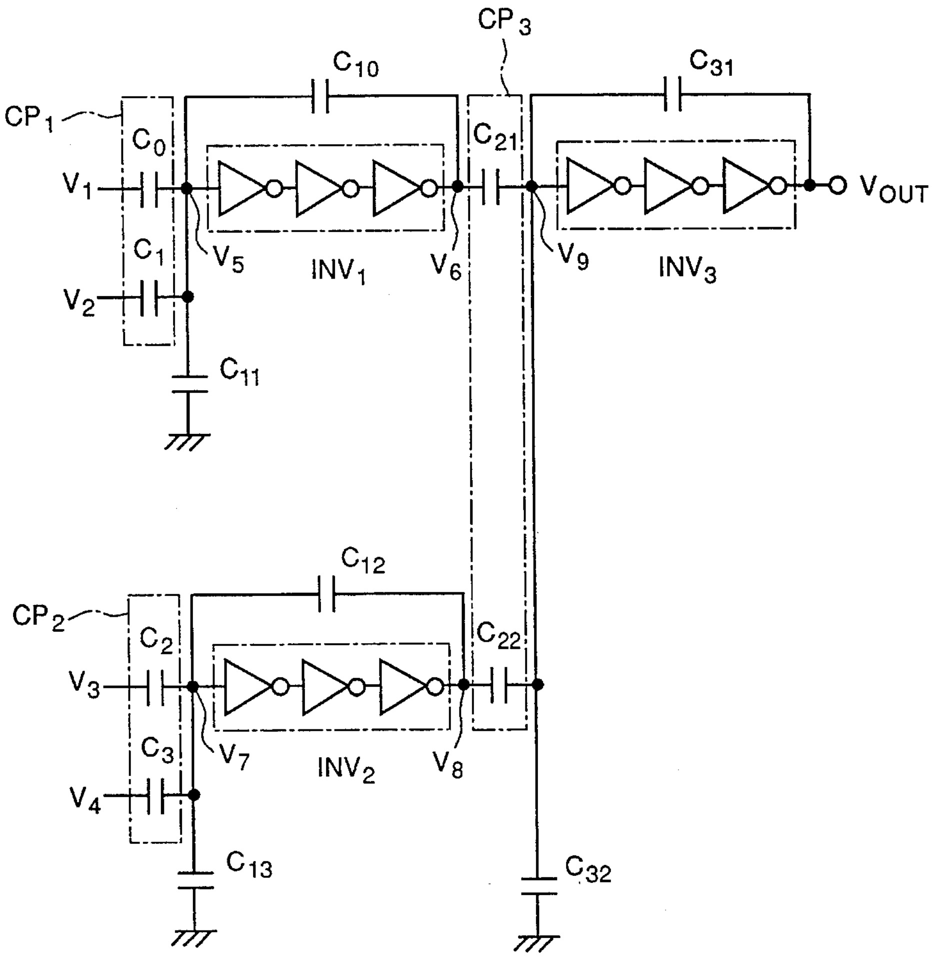
FIG. 2 is a circuit diagram showing an embodiment of the second embodiment of the present invention using a weighted summing circuit.

FIG. 2 is a second embodiment of the present invention. It includes a capacitive coupling $CP_1$, an inverter $INV_1$, a capacitive coupling $CP_2$, an inverter $INV_2$, and a capacitive coupling $CP_3$. The output of $CP_3$ is connected to inverter $INV_3$. The output of each inverter $INV_1$, $INV_2$ and $INV_3$ is fed back to its respective input through capacitances $C_{10}$, $C_{12}$ and $C_{31}$, respectively. The outputs of $CP_1$, $CP_2$ and $CP_3$ are each connected to ground through weighted capacitances $C_{11}$, $C_{13}$ and $C_{32}$, respectively.

In $CP_1$ and $CP_2$, input voltages $V_1$, $V_2$, $V_3$ and $V_4$ are input to capacitances $C_0$, $C_1$, $C_2$ and $C_3$. As mentioned, if the input and output voltages of $INV_1$ and $INV_2$ are defined as $V_5$, $V_6$, $V_7$ and $V_8$ and an input voltage of $INV_3$ is defined as $V_9$, then formulas (9), (10) and (11) are obtained.

$$V_6=\frac{V_5(C_0+C_1+C_{10}-C_{11})-C_0V_1-C_1V_2}{C_{10}} \quad (9)$$

$$V_8=\frac{V_7(C_2+C_3+C_{12}-C_{13})-C_2V_3-C_3V_4}{C_{12}} \quad (10)$$

$$C_{21}V_6+C_{22}V_8+C_{31}V_{out}+V_9(C_{32}-C_{21}-C_{22}-C_{31})=0 \quad (11)$$

Formulas (9) and (10) may be input to (11) to obtain formula (12).

$$V_{out}=V_9(C_{21}+C_{22}+C_{31}-C_{32})/C_{31}- \quad (12)$$

-continued $$C_{21}\{V_5(C_0+C_1+C_{10}-C_{11})-(C_0V_1+C_1V_2)\}/C_{10}C_{31}-$$
$$C_{22}\{V_7(C_2+C_3+C_{12}-C_{13})-(C_2V_3+C_3V_4)\}/C_{12}C_{31}$$

Just as in the circuit of FIG. 1, when $V_1=V_2=V_3=V_4=0$, when $V_5=V_7=V_9=V_{off}$, so formula (13) is obtained.

$$V_{out}=V_{off}(C_{21}+C_{22}+C_{31}-C_{32})/C_{31}-V_{off}(C_0+C_1+C_{10}-C_{11})C_{21}/C_{10}C_{31}-V_{off}(C_2+C_3+C_{12}-C_{13})C_{22}/C_{12}C_{31} \quad (13)$$

If the offset voltage is deleted, then $V_{out}=0$, as the right side of formula (12) becomes 0.

Formula (14) shows that the closed loop gains of $INV_1$ and $INV_2$ weighted by summing by $CP_3$ is equal to the closed loop gain of $INV_3$. Also, weighted capacitances $C_{11}$, $C_{13}$ and $C_{32}$ help to increase the degree of freedom of setting $C_0$, $C_1$, $C_2$, $C_3$, $C_{10}$, $C_{12}$, $C_{21}$, $C_{22}$ and $C_{31}$.

$$(C_{21}+C_{22}+C_{31}-C_{32})/C_{31}=(C_{21}/C_{31})(C_0+C_1+C_{10}-C_{11})/C_{10}+(C_{22}/C_{31})(C_2+C_3+C_{12}-C_{13})/C_{12} \quad (14)$$

A third embodiment of a multiplication circuit according to the present invention will now be described with reference to FIG. 3.

Figure 3:
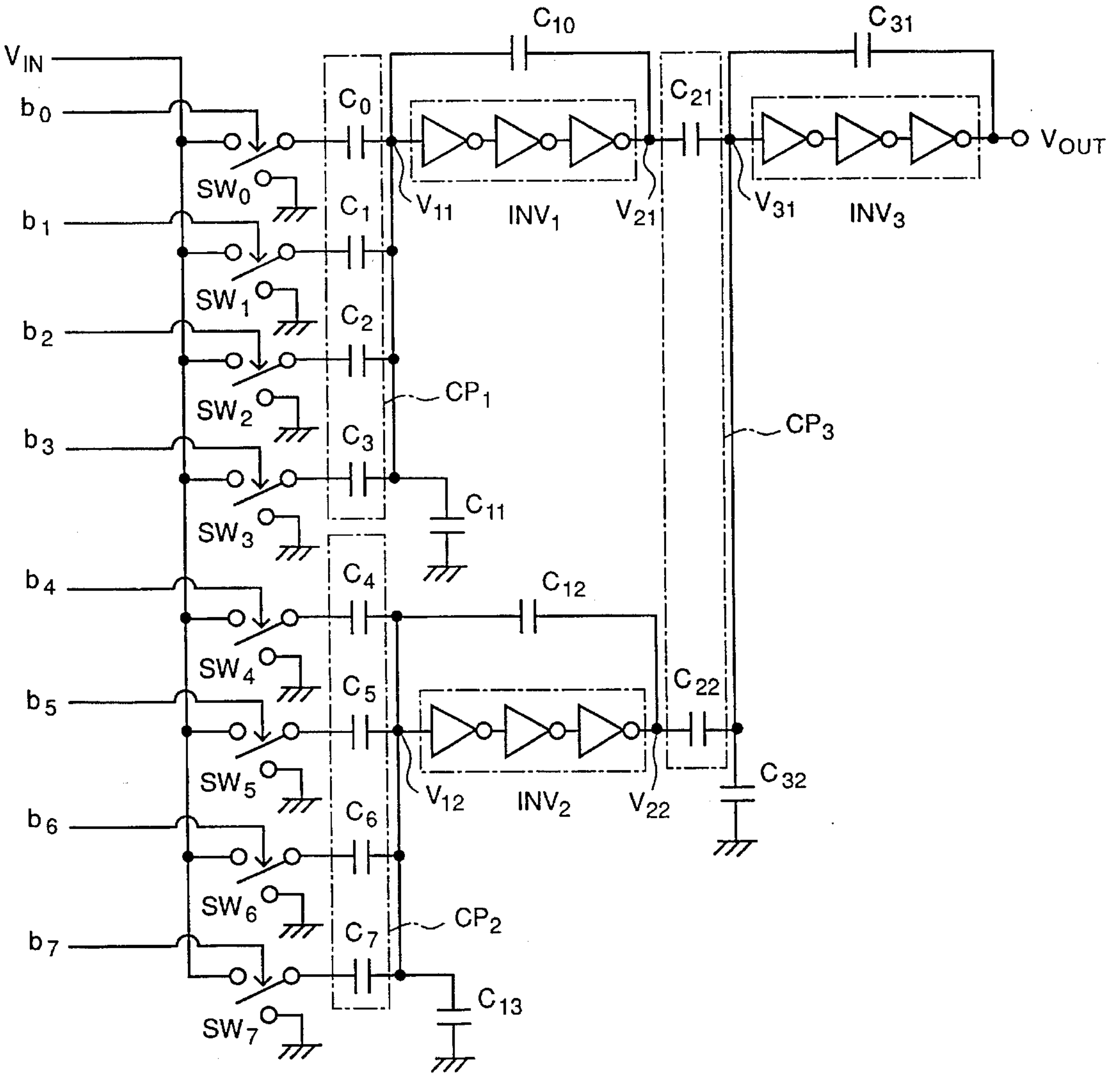
FIG. 3 is a circuit diagram showing an embodiment of a multiplication circuit according to the present invention relating to a weighted summing circuit.

In FIG. 3, a multiplication circuit has switching means $SW_0$ to $SW_7$ to selectively input analog data $V_{in}$, and these switching means are controlled by each of digital data bits $b_0$ to $b_7$, respectively. Switching means $SW_0$ to $SW_3$ are connected to a first group of capacitances $C_0$ to $C_3$, respectively, $SW_4$ to $SW_7$ are connected to a second group of capacitances $C_4$–$C_7$, respectively, and group is united by capacitive coupling $CP_1$ and $CP_2$.

Capacitive coupling $CP_1$ is composed of capacitances $C_0$ to $C_3$, and $CP_2$ is composed of capacitances $C_4$ to $C_7$, $C_0$ to $C_3$ have capacitances in proportion to the weights of $b_0$ to $b_3$. $C_4$ to $C_7$ have capacities in proportion to the weights of $b_4$ to $b_7$. Furthermore, $CP_1$ and $CP_2$ are grounded through capacitances $C_{11}$ and $C_{13}$.

The outputs of $CP_1$ and $CP_2$ are input to inverters $INV_1$ and $INV_2$ and the outputs of each inverter $INV_1$ and $INV_2$ are coupled by a capacitive coupling $CP_3$. The output of $CP_3$ is output as analog data $V_{out}$ through inverter $INV_3$. $CP_3$ is grounded through capacitance $C_{32}$.

$INV_1$ to $INV_3$ are 3 serially connected inverter circuits and the configuration guarantees the output accuracy of each inverter. Each inverter's output is fed back to its input through $C_{10}$, $C_{12}$ and $C_{31}$, respectively, and the capacitance values are set in formulas (15), (16) and (17).

$$C_{10}-C_{11}=C_0+C_1+C_2+C_3 \quad (15)$$

$$C_{12}-C_{13}=C_4+C_5+C_6+C_7 \quad (16)$$

$$C_{31}-C_{32}=C_{21}+C_{22} \quad (17)$$

If the gain of $INV_1$ to $INV_3$ is G, the impressed voltages of $C_0$ to $C_7$ are $V_0$ to $V_7$, the input voltages of $INV_1$ and $INV_2$ are $V_{11}$ and $V_{12}$, the output voltages are $V_{21}$ and $V_{22}$ and the input voltage of $INV_3$ is $V_{31}$, then formulas (18) and (19) are obtained.

$$\sum_{i=0}^{3} C_i(V_i-V_{11})+C_{10}(V_{11}-V_{21})\,C_{11}V_{11}=0 \quad (18)$$

$$\sum_{i=4}^{7} C_1(V_i-V_{12})+C_{12}(V_{12}-V_{22})+C_{13}V_{12}=0 \quad (19)$$

Formulas (20) to (23) lead to formula (24).

$$C_{21}V_{21}+C_{22}V_{22}+C_{31}(V_{31}-V_{out})+C_{32}V_{31}=0 \quad (20)$$

$$V_{21}=GV_{11},\ V_{22}=GV_{12},\ V_{out}=GV_{31} \quad (21)$$

$$V_{21}=\sum_{i=0}^{3} C_iV_i/C_{10} \quad (22)$$

$$V_{22}=\sum_{i=4}^{7} C_iV_i/C_{12} \quad (23)$$

$$V_{out}=(C_{21}V_{21}+C_{22}V_{22})/C_{31} \quad (24)$$

$SW_i$ is connected with $V_{in}$ or ground depending upon the relevant control bit $b_0$ to $b_7$. Thus, $V_i=V_{in}$ or 0.

$$C_i=2^i\times C_u \text{ (i=0 to 3)} \quad (25)$$

$$C_i=2^{i-4}\times C_u \text{ (i=4 to 7)} \quad (26)$$

$$C_{11}=C_{13}=C_{32}=C'' \quad (27)$$

$C_u$ is a unit of capacitance.

$$C_{22}=2^4\times C_{21} \quad (28)$$

$$C_{31}=2^4\times C_u \quad (29)$$

If formulas (25) to (29) are defined, then the total output is a multiplication result of analog data and digital data as shown below.

$$V_{out}=\sum_{i=0}^{7} 2^ib_iV_{in}/2^8 \quad (30)$$

If formula (31) is defined, then formula (32) is obtained. It has twice the value of formula (30). By controlling level, a range of capacitances can be selected.

$$C_{31}=2^3\times C_u \quad (31)$$

$$V_{out}=\sum_{i=0}^{7} 2^ib_iV_{in}/2^7 \quad (32)$$

Obviously, from formula (26), it is enough for a range of capacitances from $C_0$ to $C_7$ to be $2^3$ order because the weight of bits $b_0$ to $b_3$ of digital data and $b_4$ to $b_7$ of digital data are determined as different groups and the group weights are multiplied to result in a higher group.

As mentioned above, a weighted summing circuit according to the present invention in a composition inputting an output of a capacitive coupling to serially connected first and second inverters and grounded weighted capacitance is connected to a capacitance and a capacitive coupling connecting the first and the second inverters such that the closed loop gains of the first and second inverters are substantially equal. Then, the closed loop gains of the first and the second inverters are balanced so that bias voltage influence is minimized.

What is claimed is:

1. A weighted summing circuit comprising:

a capacitive coupling having a plurality of inputs and an output, each input receiving one of a plurality of input voltages, said capacitive coupling generating a weighted sum of said plurality of input voltages;

a first inverter connected to said output of said capacitive coupling, said first inverter having a first inverter input and a first inverter output;

a first feedback capacitance connected between said first inverter input and said first inverter output;

a connecting capacitance having a first terminal connected to said first inverter output, and a second terminal;

a second inverter having a second inverter input connected to said second terminal of said connecting capacitance, and a second inverter output;

a second feedback capacitor connected between said second inverter output and said second inverter input;

a first grounding capacitor connected between said first inverter input and ground; and a second grounding capacitor connected between said second inverter input and ground, wherein the closed loop gains of said first inverter and said second inverter are substantially equal.

2. The weighted summing circuit of claim 1, wherein each of said plurality of voltages is selectively supplied to one of said inputs of said capacitive coupling in response to a data control signal.

3. A weighted summing circuit comprising:

a plurality of first capacitive couplings, each having a plurality of inputs and an output, each input receiving one of a plurality of input voltages, each first capacitive coupling generating a weighted sum of said plurality of input voltages;

a plurality of first inverters, each first inverter having a first inverter input connected to said output of one of said plurality of first capacitive couplings, and a first inverter output;

a plurality of first feedback capacitors, each first feedback capacitor connected between said first inverter output and said first inverter input of one of said plurality of first inverters;

a plurality of first grounding capacitors, each first grounding capacitor connected between said first inverter input of one of said first inverters and ground;

a second capacitive coupling having a plurality of inputs and an output, each input connected to one of said first inverter outputs of said plurality of first inverters;

a second inverter having a second inverter input connected to said output of said second capacitive coupling, and a second inverter output;

a second feedback capacitor connected between said second inverter output and said second inverter input; and a second grounding capacitor connected between said second inverter input and ground, wherein a weighted summation of the closed loop gains of said plurality of first inverters is substantially equal to the closed loop gain of said second inverter.

4. The weighted summing circuit of claim 3, wherein each of said plurality of voltages is selectively supplied to one of said inputs of said first capacitive coupling in response to a data control signal.

* * * * *